United States Patent [19]
Davies

[11] Patent Number: 5,917,972
[45] Date of Patent: Jun. 29, 1999

[54] OPTICAL DEVICE

[75] Inventor: David A. Davies, Great Finborough, United Kingdom

[73] Assignee: British Telecommunications Public Limited Company, London, United Kingdom

[21] Appl. No.: 08/809,130

[22] PCT Filed: Sep. 14, 1995

[86] PCT No.: PCT/GB95/02191

§ 371 Date: Mar. 24, 1997

§ 102(e) Date: Mar. 24, 1997

[87] PCT Pub. No.: WO96/09668

PCT Pub. Date: Mar. 28, 1996

[30] Foreign Application Priority Data

Sep. 14, 1994 [EP] European Pat. Off. .............. 94306753
Dec. 20, 1994 [GB] United Kingdom .................... 9425729

[51] Int. Cl.[6] ...................................................... G02B 6/26
[52] U.S. Cl. .................................................. 385/43; 372/50
[58] Field of Search ............................... 385/2, 3, 9, 43, 385/129–132; 372/20, 43–50

[56] References Cited

U.S. PATENT DOCUMENTS

| | | | |
|---|---|---|---|
| 4,802,187 | 1/1989 | Bouley et al. | 372/96 |
| 4,815,084 | 3/1989 | Scifres et al. . | |
| 5,140,651 | 8/1992 | Soref et al. | 385/2 |
| 5,179,568 | 1/1993 | Lang . | |
| 5,202,948 | 4/1993 | Suhara et al. . | |
| 5,392,308 | 2/1995 | Welch et al. | 372/50 |
| 5,442,723 | 8/1995 | Vinchant et al. | 385/129 |
| 5,517,517 | 5/1996 | Liou | 372/19 |

FOREIGN PATENT DOCUMENTS

0135594 A1  4/1985  European Pat. Off. .
0632299 A2  1/1995  European Pat. Off. .

OTHER PUBLICATIONS

Spano et al, "Frequency Conversion in Semiconductor Lasers and Amplifiers", European Transactions on Telecommunications and Related Technologies, vol. 5, No. 4, Jul. 1994, Milano, Italy, pp. 103–112, XP 000460566.

Koyama et al, "Multiple–Quantum–Well GaInAs/GaInAsP Tapered Broad–Area Amplifiers with Monolithically Integrated Waveguide Lens for High–Power Applications", IEEE Photonics Technology Letters, vol. 5, No. 8, Aug. 1, 1993, pp. 916–919, XP 000399645.

Stubkjaer et al, "Semiconductor Optical Amplifiers As Linear Amplifiers, Gates and Wavelength Converters", Proceedings of the European Conference on Optical Communication (EC, Montreux, Sep. 12–16, 1993 Invited Papers, vol. 1, Sep 12,1993, Swiss Electrotechnical Association, pp. 60–67, XP 000492152.

(List continued on next page.)

*Primary Examiner*—Akm E. Ullah
*Attorney, Agent, or Firm*—Nixon & Vanderhye PC

[57] ABSTRACT

An optical device for use as an amplifier or modulator comprises a semiconductor substrate with an elongate waveguide region with a light guiding boundary that extends between an input and an output for optical radiation. An optically active layer of material produces amplification of light travelling in the waveguide region. The width of the waveguide region tapers outwardly from the input to allow amplification of input optical signals, and tapers toward the output so as to concentrate the amplified light in a single mode to the output. The concentration of the amplified light in the active region may produce non-linear effects which are exploited in order to achieve data modulation or switching. Optionally, the waveguide region may include a first active region to produce optical amplification, and a second passive region for concentrating light to the output.

41 Claims, 3 Drawing Sheets

OTHER PUBLICATIONS

Stubkjaer et al, "Recent Advances in Semiconductor Optical Amplifiers and Their Applications", Proceedings of the International Conference on Indium Phosphide and Related Materials, Newport, Apr. 21–24, 1992, No. Conf. 4, Apr. 21, 1992 Institute of Electrical and Electronics Engineers, pp. 242–245, XP 000341267.

Patent Abstracts of Japan, vol. 007, No. 136 (E–181) Jun. 14, 1983 & JP A58050790 (Mitsubishi Denki KK), Mar. 25,1983.

Patent Abstracts of Japan, vol. 016, No. 112 ( E–1180), Mar. 19, 1992 & JP A 03284892 (Fujitsu Ltd) Dec. 16, 1991.

Doussiere et al, "Clamped Gain Travelling Wave Semiconductor Optical Amplifier for Wavelength Division Multiplexing Applications", Proceedings of the $14^{TH}$ IEEE International Semiconductor Laser Conference, Sep. 19–23, 1994, Maui, Hawai, USA, Paper W2.1,, pp. 185–186, X000514864.

Mehuys et al, "5.25–W CW Near–Diffraction–Limited Tapered–Stripe Semiconductor Optical Amplifier", IEEE Photonics Technology Letters, vol. 5,No. 10, Oct. 1993, pp. 1179–1182.

Parke et al, "2.0 W CW, Diffraction–Limited Operation of a Monolithically Intergrated Master Oscillator Power Amplifier", IEEE Photonics Technology Letters, vol. 5, No. 3, Mar. 1993, pp. 297–300.

Bendelli et al, A New Structure for High–Power TW–SLA, IEEE Photonics Technoloy Letters, vol. 3, No. 1, Jan. 1991, pp. 42–44.

Williams et al, "Q–Switched Bow–Tie Lasers for High Energy Picosecond Pulse Generation", Electronics Letters, Feb. $17^{th}$ 1994, vol. 30, No. 4, pp. 32–321.

OPTICAL DEVICE

This application claims the benefit under 35 U.S..C §365(c) of international application number PCT/GB95/02191 filed on Sep. 14, 1995.

FIELD OF THE INVENTION

This invention relates to an optical device and has particular but not exclusive application to integrated structures formed on a substrate, for use as an amplifier or a modulator.

BACKGROUND

It is well known that certain materials such as semiconductors are capable of acting as optical amplifiers. For example, when certain semiconductors, which exhibit a band gap, are subject to an injected electric current, an incident photon causes an electron to traverse the gap with the result that an additional photon is generated, thereby producing optical amplification. Semiconductor optical amplifiers and lasers which operate in this way are well known and reference is directed to "Long Wavelength Semiconductor Lasers" G. P. Agrawal and N. K. Dutta, Van Nostrand, Chapters 1 to 6.

The semiconductor material which is used as the active amplification region of the device suffers from a gain-saturation effect which imposes a limitation on the maximum power that can be obtained. In order to overcome this problem, proposals have been made in the past to provide the active amplification region as a tapered structure on the substrate, which widens along its length so that as amplification proceeds, a greater cross section of material is available for amplification, permitting increased amplification power to be achieved. Reference is directed to Mehuys et al: "525 W, CW Near Diffraction Limited Tapered Stripe Semiconductor Optical Amplifier", IEEE Phot Tech. Letts. 5 pp 1179–1182, 1993. In this arrangement, an expanding path through the active amplification region is achieved by means of an input lens arrangement and the resulting amplified light is collected by an output lens. Another arrangement with an expanding, tapered active region, but with an integrated laser source, is described in Parke et al "2.0 W CW Diffraction Limited Operation of a Monolithically Integrated Master Oscillator Power Amplifier", IEEE Phot Tech. Letts, 5 297–300 1993. Reference is also directed to a similar structure described in Bendelli et al "A New Structure for High Power TWSLA", IEEE Phot Tech Lets. 1, 1991, pp 42–44.

Reference is also directed to "Q-Switched Bow-Tie Lasers for High Energy Picosecond Pulse Generation," K. A. Williams et al, Elect Lett, February 1994, Vol 30 No. 4, pp 320–21 which illustrates outwardly tapering amplifier regions in a laser to avoid gain saturation. Reference is made to EP-A- 0 135 594 which discloses a semiconductor laser wherein tapering of an electrode is used to improve astigmatism.

In Koyama et al "Multiple Quantum Well GaInAs/GaInAsP Tapered Broad Area Amplifiers with Monolithically integrated Waveguide Lens for High Power Applications", IEEE Phot Tech Letts, 5 pp 916–919, 1993, there is described the use of an integrated lens to re-focus the output of the expanding, tapered active region in order to simplify coupling into a single mode fibre. However, in practice, difficulties arise in fabricating the integrated lens.

SUMMARY OF THE INVENTION

In accordance with the present invention there is provided an optical device comprising an elongate waveguide having a boundary that extends along the length thereof to an optical output at one end, an optical input at the other end of the waveguide region for introducing optical radiation to be amplified therein, and an active material for producing amplification of light travelling in the waveguide, the region boundary being configured to concentrate the amplified light laterally within the waveguide towards the output.

Thus, by means of the invention, the light can be concentrated within the waveguide region itself, towards the output, without the need for additional lens structures.

The waveguide region may have a width which tapers along the length thereof towards the output to achieve the concentration of the amplified light.

Optical amplification can be achieved by applying an electric current to the active material, and the current density that in use passes through the active material may be imparted with a non-uniform spatial profile in order to avoid optical gain saturation. The electric current may be fed into the active material through a conductive layer configured in first and second separate portions so that different values of current can be fed to different regions of the active material.

Also, in accordance with the invention it has been appreciated that gain saturation may be used advantageously in the device to achieve modulation for data transmission purposes. The device may have a first source of optical data pulses coupled to an input to the waveguide region and a second source of optical radiation e.g. essentially continuous radiation, coupled to the waveguide region. In one embodiment of the invention, the data pulses from the first source and the radiation from the second source interact so as to produce a gain saturation in the active material, so that the radiation from the second source is amplitude modulated by the data pulses. A filter may be provided to pass preferentially the resulting pulse modulated signal. Also, the sources may interact so that the radiation from the second source is phase modulated by the data pulses from the first source at a relevant receiver, and a phase detector may be used to detect the modulation. Also, the radiation from the two sources may interact to produce radiation at the output which is of a different wavelength from the pumping radiation and the data pulses. This output radiation may be a phase conjugate of the radiation from the first source.

The active material may extend over the entire extent of the waveguide region, or for a high power amplifier, the waveguide region may include a first active portion coupled to the active material, and a second passive portion with its boundary configured to concentrate the amplified light, thereby avoiding gain saturation.

Reflective means may be provided at opposite ends of the active region in order to induce a laser action therein.

The device may be fabricated on a substrate, with the waveguide region comprising a buried heterostructure. Alternatively, the waveguide region may comprise a rib waveguide structure.

BRIEF DESCRIPTION OF THE DRAWINGS

In order that the invention may be more fully understood, embodiments thereof will now be described by way of example with reference to the accompanying drawings in which.

DETAILED DESCRIPTION

Figure 1:
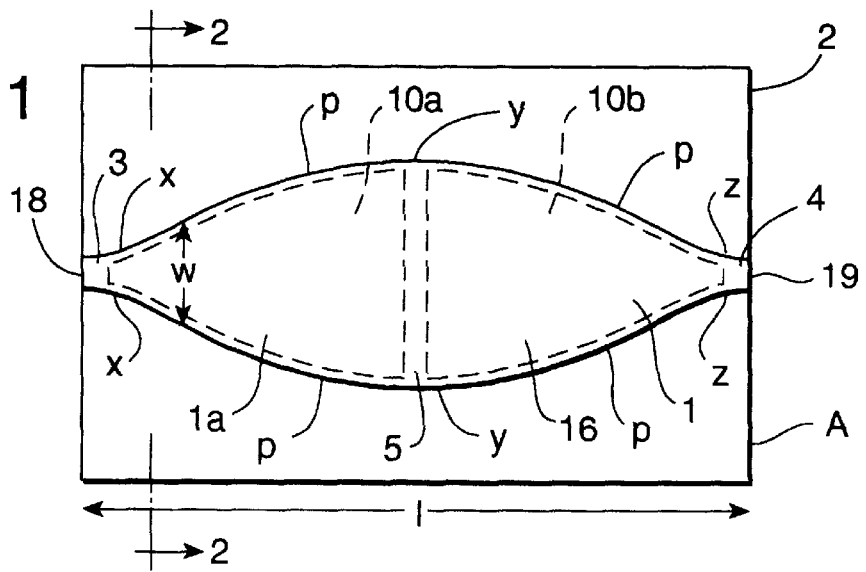
FIG. 1 is a plan view of an active amplification region for a device in accordance with the invention.

FIG. 1 illustrates in plan view a semiconductor optical device A in accordance with the present invention which, in the described embodiments is fabricated in the InGaAsP material system for use in telecommunication systems with wavelengths centred on 1.3 and 1.55 $\mu$m. The device consists of an elongate waveguide region 1 which produces active amplification, formed on a substrate 2. The elongate waveguide region 1 has an input 3 at one end for optical radiation and an optical output 4 at its other, second end. The input and output 3, 4 are configured to couple onto single mode optical waveguides e.g. optical fibres or alternatively other structures (not shown) integrated onto the substrate.

The width w of the waveguide region 1 increases progressively from the input 3 in the direction of the length l of the waveguide towards the central or intermediate region 5, from which the width w progressively decreases to the output 4. A typical example of the device has a length l of 500 $\mu$m–1 mm, with the inputs 3 and 4 having a width w of 1–2 $\mu$m, and the width w in the intermediate region being of the order of 30–40 $\mu$m.

The waveguide region 1 can be fabricated in a number of different ways and two examples will now be described with reference to FIGS. 2 to 4.

Figure 2:
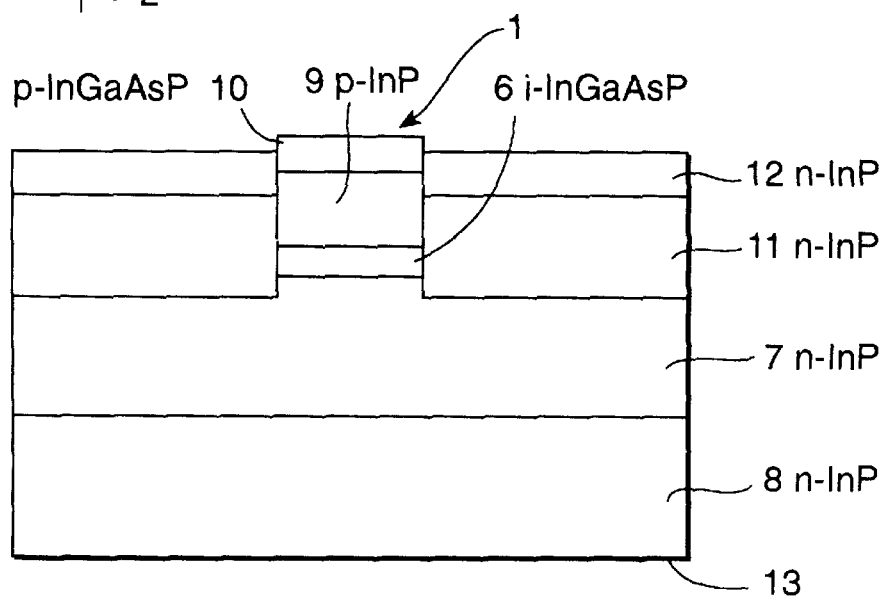
FIG. 2 is a schematic sectional view of the device shown in FIG. 1 when fabricated according to a first embodiment.

Referring now to FIG. 2, this shows a schematic cross section taken along the line 2—2 of FIG. 1 for which the waveguide region 1 is fabricated as a buried heterostructure.

Referring to FIG. 2, the waveguide region 1 comprises a layer of active i-InGaAsP material 6 formed on a n-InP layer 7, itself formed on a n-InP substrate 8. The active material 6 is overlaid by a p-InP region 9 formed with a conductive over-contact 10 of p-InGaAsP material. The general structure of the amplifier, the thicknesses of the various layers and the dopant concentrations, are conventional and reference is directed to A. W. Nelson, W. J. Devlin, R. E. Hobbs, C. G. D. Lenton and S. Wong: "High-power, low-threshold BH lasers operating at 1.52 $\mu$m grown entirely by MOVPE", Electronics Letters, Vol. 21, No. 20, pp 888–889 (Sep. 26, 1985).

Figure 3:
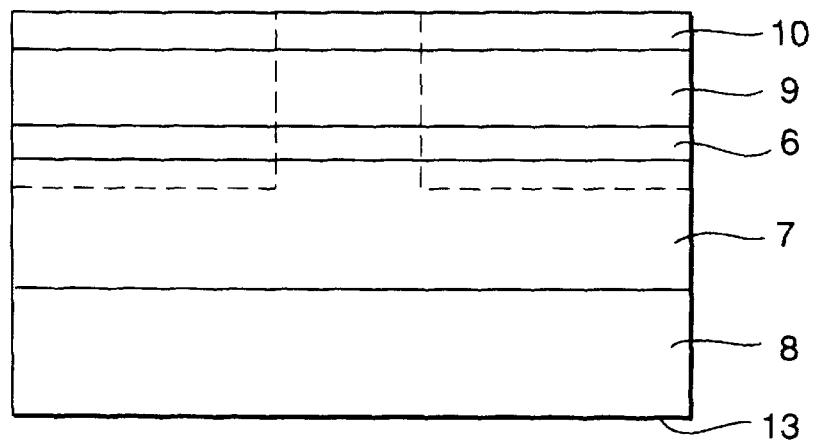
FIG. 3 is a schematic sectional view of a substrate with epitaxial layers used for forming the device as shown in FIG. 2.
Figure 4:
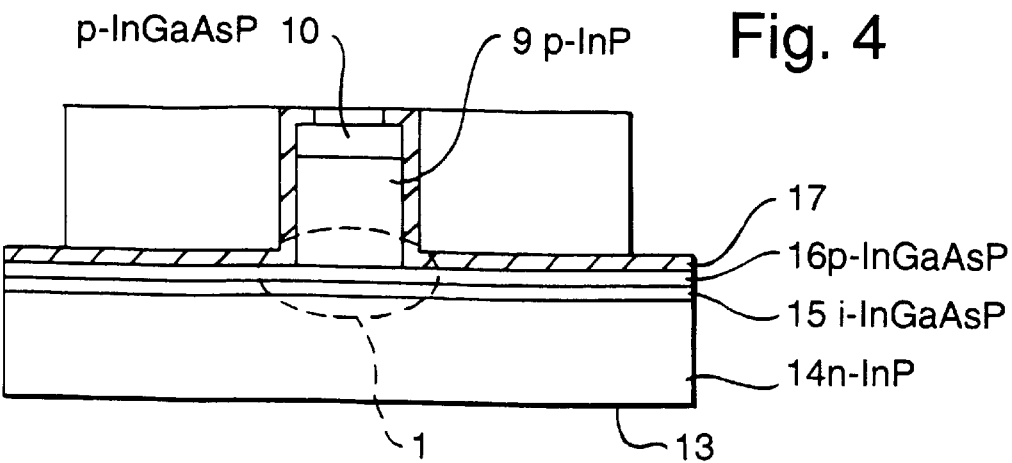
FIG. 4 is a schematic section of the device of FIG. 1 when fabricated according to a second embodiment of the invention.

Referring to FIG. 3, the structure is formed from an initial substrate 8 which is formed with layers 6, 7, 9 and 10 over its entire surface in a manner known per se, and material is then selectively etched from the regions shown in dotted outline, using a mask in a manner known per se, the mask having a shape as shown in FIG. 1, so as to define the varying width w of the waveguide region along the length thereof.

Thereafter, as shown in FIG. 2, p-InP layer 11 and n-InP layer 12 are formed overlying the selectively etched regions by standard MOVPE electric growth techniques. An electrically conductive bottom metallisation layer 13 is formed on the underside of the substrate.

Thus, the active material 6 is sandwiched between p-InP region 9 and n-InP layer 7 so that when a voltage is applied between the conductive layer 10 and the bottom layer 13, an electric current passes through the active material 6. The polarity of the voltage and the arrangement of the n and p doped layers 11 and 12 is such that in use, they form a reverse-biased junction, with the result that the current is directed selectively through the waveguide region 1 rather than to each side. Thus, photons incident on input 3 (FIG. 1) cause electrons to traverse the band gap of the active material 6 so as to generate additional photons, thereby producing optical amplification in the waveguide region. For further details of the structure of the device and various modifications thereof, reference is directed to Nelson et al, supra.

A different fabrication technique will now be described with reference to FIG. 4 which shows an alternative version of the section taken on 2—2 of FIG. 1. In this structure, the waveguide region has its boundary defined by means of a rib waveguide. The device consists of a substrate 14, formed of n-InP material with an overlayer 15 of optically active i-InGaAsP material in a waveguide region 1 shown in dotted outline. The layer 15 is overlaid by an etch-stop layer 16 of p-InGaAsP material which is overlaid by a rib 9 of p-InP material, itself covered by a conductive contact region 10 of p-InGaAsP material. For further details of the general structure of a ridge waveguide structure, reference is directed to I. P. Kaminow, R. E. Nahory, M. A. Pollack, I. W. Stulz and J. C. De Winter: "Single-mode c.w. ridge-waveguide laser emitting at 1.55 $\mu$m", Electronics Letters, Vol. 15, No. 23, pp 763–764 (November 1979).

The layers 9 and 10 are formed in the curved shape shown in FIG. 1 by a lithographic mask and selective etching in a similar manner to that described with reference to FIG. 2. The resulting structure is overlaid with a dielectric material 17, typically silicon dioxide. When a voltage is applied to the layer 10, a current is established through the region of layer 15 which is overlaid by the layer 9, so that amplification occurs therein within the region 1 shown in dotted outline. It will be appreciated that the optical confinement produced by the structure shown in FIG. 4 is less well defined than with the configuration of FIG. 2.

Referring again to FIG. 1, the single mode optical signal applied to input 3 is thus amplified within the waveguide region 1. The single mode expands adiabatically towards the central, intermediate region 5, and is thereafter adiabatically contracted, still in the single mode, and inserted through the output 4 e.g. into an output optical fibre connected thereto (not shown). By "adiabatic" we mean no significant coupling into higher order transmission modes. Thus, the boundaries of waveguide region 1 themselves act to concentrate the amplified light laterally to the output 4, with the advantage that no additional lens structures are required to focus the amplified light into the output optical fibre, as in the prior art.

The conductive layer 10 is arranged in two portions 10a, 10b that overlie corresponding regions 1a, 1b of the waveguide region 1. The current densities in the regions 10a and 10b are selected individually so as to be higher in region 10a than in region 10b, such that amplification primarily occurs in the active material 6 in the region 1a, where the outwardly tapered shape of the region reduces the risk of gain saturation. In the region 1b, the waveguide region 1 acts to concentrate the resulting amplified light into the output 4 without further significant amplification in the underlying active material 6, so as to minimise the risk of gain saturation. The region 10a in this example is fed with a higher current than the region 10b in order to achieve the desired current density differential.

Furthermore, the conductive layer 10 could be arranged in more than two portions so as to profile the current density spatially through the active material 6 and thereby minimise optical gain saturation.

When the device is used as an amplifier, anti-reflection coatings are provided on facets 18, 19 for input 3 and output 4. In this case, the reflectivity needs to be sufficiently low to avoid laser action even at high drive currents, i.e. reflectivity of the order of 0.001 or, preferably, 0.0001. Alternatively, if it is desired to promote a laser action within the waveguide region 1, one or more of the facets 18, 19 may be left uncoated or one end may be high-reflective coated, so as to produce semi-reflective end regions that promote resonance within the region. The uncoated reflectively is normally around 0.3, and a high-reflectivity coating would produce reflectivities of around 0.9 or higher.

Furthermore, in accordance with the invention, it has been appreciated that when a suitable bias voltage is applied to both of the regions 10a, 10b, non-linear effects such as gain saturation produced in the region 1b, can be used to produce data modulation, as will now be described with reference to FIGS. 5 and 6.

Figure 5:
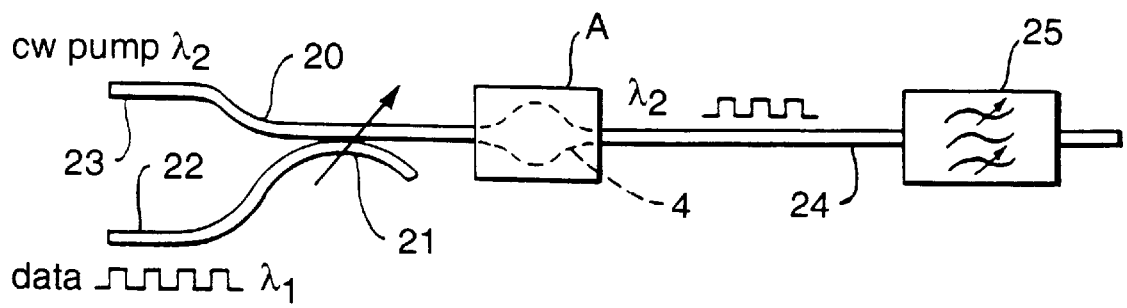
FIG. 5 is a schematic diagram of a device in accordance with the invention, which uses gain saturation and/or a wavelength conversion in order to achieve data modulation.

In FIG. 5, the device A of FIG. 1 is shown with an optical fibre 20 connected to its input, the fibre including a coupler 21 which has a first input port 22 that receives a stream of optical data pulses at a wavelength $\lambda_1$ and acts as a first source for the device, and a second input port 23 that receives essentially continuous wave (cw) radiation at a second different wavelength $\lambda_2$, the second port 23 acting as a second source for the device A. The wavelengths $\lambda_1$, $\lambda_2$ are chosen to be within the gain bandwidth of the active material 6 in the waveguide region 1. In use, both of the regions 10a, 10b are fed with a bias voltage that results in an optical amplification, and the level of amplification in region 1b (FIG. 1), in the absence of $\lambda_1$ is close to, but does not exceed the level at which gain-saturation occurs.

When the pulse stream $\lambda_1$ is applied, no gain-saturation occurs in the absence of a pulse, whereas during the occurrence of a pulse, the increased amplitude raises the optical power level sufficiently to produce gain-saturation so that the gain of the material 6 in waveguide region 1 collapses and a significantly reduced level of the radiation $\lambda_2$ reaches the output 4. For a general discussion of the technique, reference is directed to B. Mikkelsen et al., ECOC 1993 post deadline paper ThP 12.6 pp. 73–6 "20 Gbit/s Polarisation Independent Wavelength Conversion in a Semiconductor Laser Amplifier". The device A according to the invention has the significant advantage that the waveguide region 1a produces sufficient amplification of the data pulse stream $\lambda_1$ and the cross modulation can then occur in region 1b, in an integrated device, thereby providing a very compact and efficient means for producing switching using gain saturation, for use as a modulator. Also, the speed of the cross modulation effect is enhanced by the concentration of light produced in the region 1b, in comparison to a conventional amplifier with an untapered waveguide.

The output from the device A in FIG. 5 is fed through an optical fibre 24 to a bandpass filter 25 tuned to the radiation wavelength $\lambda_2$ in order to separate the amplified output signal.

Figure 6:
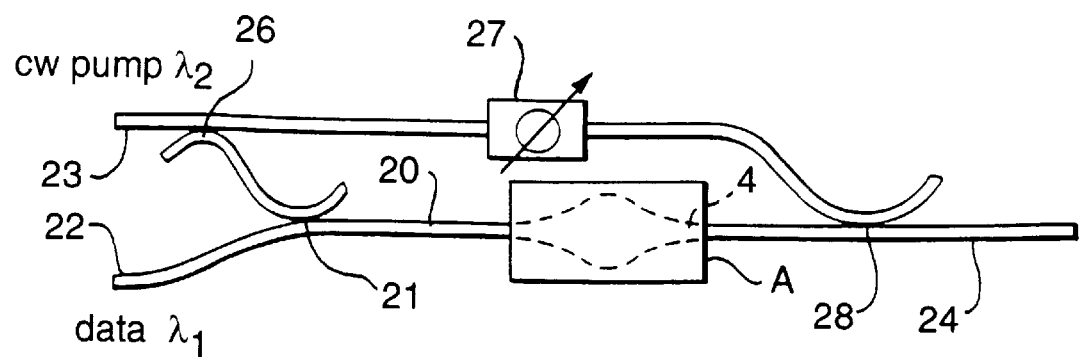
FIG. 6 illustrates a version of the device which uses a phase shift in its output to achieve phase modulated data pulses.

The device A according to the invention can also be used as in FIG. 6 to exploit another non-linear effect. As described in B. Mikkelsen et al, supra an input at wavelength $\lambda_1$ can be used to phase shift radiation at a different wavelength $\lambda_2$. This effect is exploited in the configuration shown in FIG. 6 to achieve phase modulation. The input data pulses $\lambda_1$ and the cw radiation $\lambda_2$ are applied through coupler 26 to the input 3 of the device A through coupler 21, as previously described with reference to FIG. 5 and additionally, the cw radiation is fed through the coupler 26 and a variable amplifier or attenuator 27 to be mixed with the output of the device A through a coupler 28. The cw radiation $\lambda_2$ is phase modulated in the device A by the data pulses $\lambda_1$. The resulting phase modulation produced at the output of device A is compared, by means of the coupler 28, with the phase of the cw radiation $\lambda_2$, which acts as a reference, with the result that the output in fibre 24 is amplitude modulated in accordance with the phase modulation that occurs in device A.

A further non-linear effect is described in M. C. Tatham et al., "20 nm Optical Wavelength Conversion Using Nondegenerate Four Wave Mixing", IEEE Phot Tech Lett, 5 pp 1303–6, 1993 and concerns wavelength conversion. When the data pulses at wavelength $\lambda_1$ and a continuous pumping signal at wavelength $\lambda_2$ are fed into an amplifier, a third, different wavelength signal can be produced by a non-linear third order, intensity dependent effect. This effect can be exploited by means of the apparatus as shown in FIG. 5, in which the filter 25 is tuned to the third wavelength in order to separate it from the input wavelengths $\lambda_1$ and $\lambda_2$. The third wavelength signal $\lambda_3$ may be a phase conjugate of the cw radiation $\lambda_2$ as described in M. C. Tatham et al, "Compensation of fibre Chromatic Dispersion by Optical Phase Conjugation in a Semiconductor Laser Amplifier", El Lett., 29 pp 1851–2, 1993.

Referring again to FIG. 1, the specific shape adopted for the waveguide region 1 varies from application to application. In many situations, a symmetrical configuration as shown in FIG. 1 is advantageous, with the locus of the boundary of the region 1 conforming to portions of circles, in regions x, y, z close to the inputs and outputs, and in the intermediate region 5. The connecting regions of the boundary, in regions p conform to portions of a parabola. Many other modifications and variations will be readily apparent and the rate of increase and decrease of the width w in the waveguide region can vary along the length thereof depending upon the particular application and non-linear effect that is to be exploited.

Also, to increase the non linear effect, the output 4 of the device may include a further non-tapered elongate region (not shown) formed integrally on the substrate, which may include a continuation of the layer 6 of optically active material.

Another embodiment for use as a high power amplifier will now be described with reference to FIGS. 7 to 9. It can be considered as a modification of the embodiment shown in FIGS. 1 and 2 and like parts are shown with the same references numerals. In the embodiments described previously, the active material 6, which produces optical amplification, extends over the entire extent of the optical waveguide region 1. However, in the embodiments of FIGS. 7 to 9, rather than have the active material 6 disposed over the entire extent of the waveguide region 1, the active material 6 is disposed solely in a first active portion 30 of the waveguide region 1, and the remaining part of the waveguide 1 constitutes a second, passive portion 31, which is transparent for the relevant wavelength range of light travelling in the waveguide. Thus, light travelling in the waveguide is amplified solely in the active portion 30, by the process previously described. Since the width of the waveguide w increases progressively from the input 3 to the intermediate region 5 in the active portion 30, the increasing power produced by the amplification does not cause gain saturation. The resulting amplified light then passes into the passive portion 31. The width of the waveguide region 1 in the passive portion thereof, progressively decreases towards the output 4. This causes a lateral concentration of light within the waveguide towards the output. Since the material of the passive portion of the waveguide is non-active, gain saturation cannot occur as a result of the concentrating effect of the tapering boundary of the waveguide region. As a result, the device can be used advantageously as a high power amplifier, with the passive portion 31 providing an integrated structure for directing the amplified light into the output 4 e.g. to an optical waveguide, without the problem of gain saturation.

The active and passive portions 30, 31 of the waveguide can be formed in a number of different ways. Referring now to FIG. 8, this shows a section taken along 8—8 of FIG. 7 according to a first structure. The general structure is similar to that shown in FIG. 2. However, the waveguide region 1 is defined by an additional layer 32 of InGaAsP material, which has a bandgap selected so that it is transparent to the amplified optical radiation and is hence passive. The optically active material is provided as the layer 6 which, as previously described, is formed of i-InGaAsP material, but in this embodiment, overlies the layer 32 solely in the active portion 30. The layer 6 thus produces amplification of light travelling in the waveguide. As previously described, the layer 6 is sandwiched between a p-InP layer 9 and a n-InP layer 7, with a conductive over-contact 10 of p-InGaAsP material. In order to fabricate the structure, the layers 32, 6, 9 and 10 are formed as continuous layers over the entire surface area and then the layers 6, 9 and 10 are selectively etched from the passive portion, and replaced by a cladding region 33 of i-InP material, which is grown in its place. The resulting configuration is then selectively masked and etched to provide the curved waveguide boundary, as described with reference to FIGS. 1 and 2.

Figure 7:
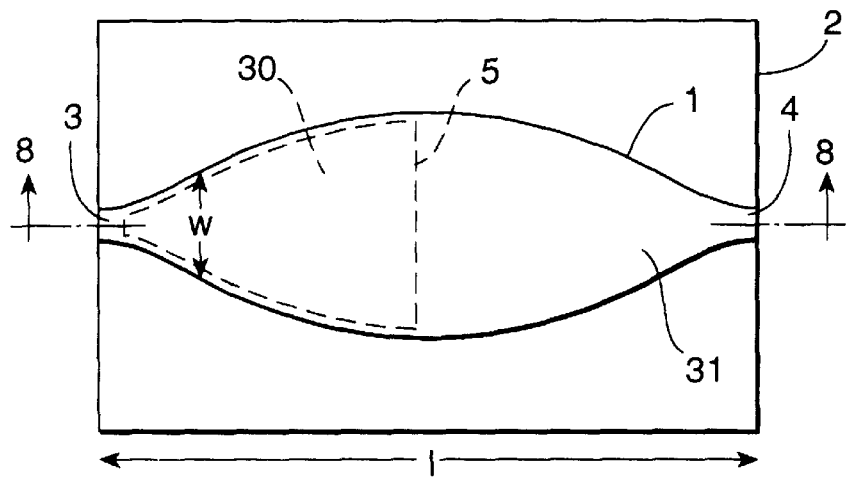
FIG. 7 is a plan view of another optical device in accordance with the invention.
Figure 8:
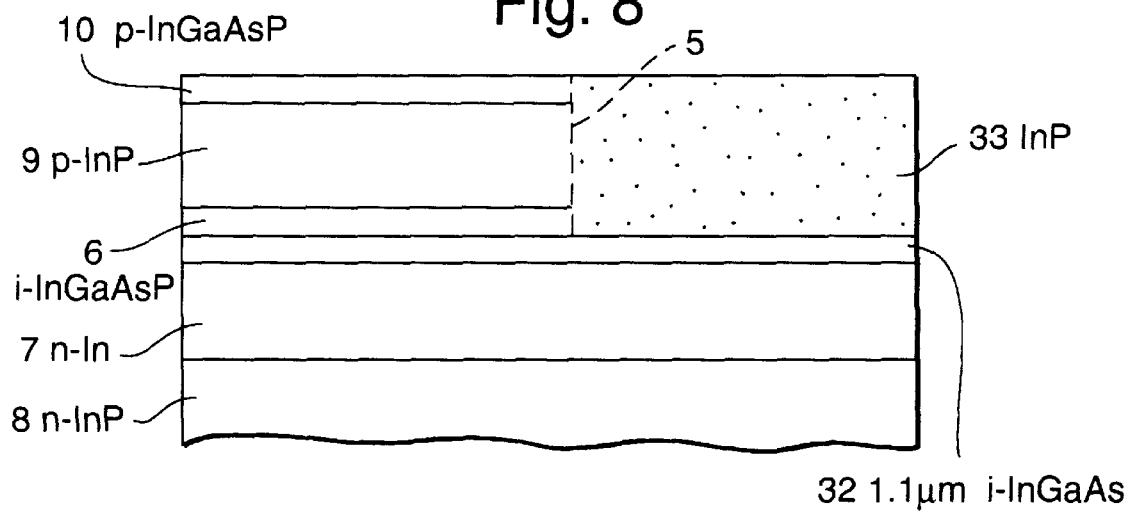
FIG. 8 is a schematic sectional view of the device shown in FIG. 7 taken along the line 8—8, when fabricated according to a first procedure.

In a specific example of the device shown in FIGS. 7 and 8, the active layer 6 was formed 0.15 µm thick with a bandgap of about 1.55 µm and the layer 32 had a thickness of 0.4 µm and a bandgap of 1.1 µm.

Alternatively, the waveguide may be formed as a ridge structure, by forming the layer 32 as a continuous layer, and forming a ridge from the layers 6, 9, 10 and 33 according to general techniques disclosed in Sherlock, G., Burton, J., Fiddyment, P., Sully, P., Kelly, A., and Robertson M. "An Integrated 2×2 Optical Switch with Gain", Electronics Letters 30 (1994) pp 137–8.

Figure 9:
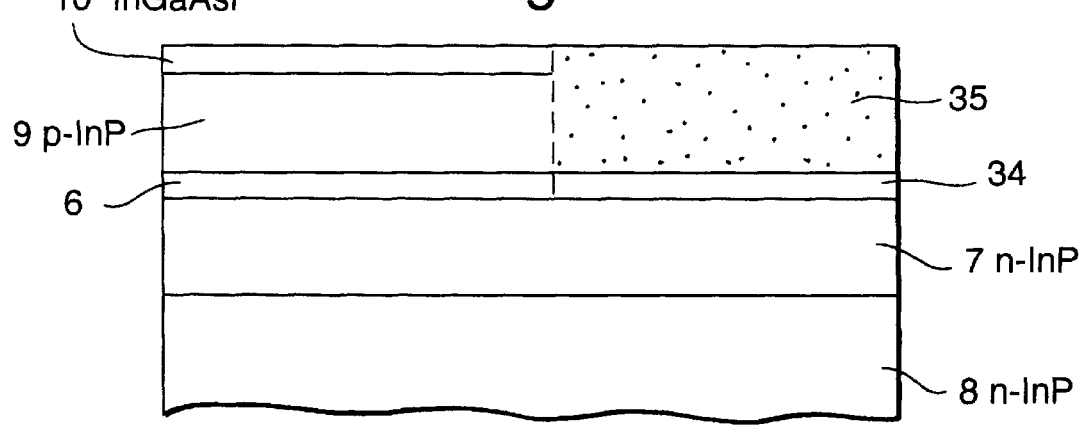
FIG. 9 is a corresponding sectional view of a device shown in FIG. 7, when fabricated according to a second procedure.

Referring to a second form of the high power amplifier shown in FIG. 9, the passive layer 32 is omitted. The layers 6, 9 and 10 are selectively etched and then a passive layer 34 of InGaAsP is grown so as to form a continuation of the layer 6, as a heterolayer. The layer 34 typically chosen to have a bandgap of 1.3 µm when the device is to operate at 1.5 µm. The layer 34 can be grown by metal-organic vapour phase epitaxy (MOVPE). By this technique, the layers 6 and 34 can be formed with an optical quality waveguide junction at which no significant reflection occurs. The layer 34 is then covered by a cladding region 35 of p-InP material. The resulting structure is then selectively masked and etched to provide the curved waveguide boundary, as previously described. A general example of MOVPE can be found in "1.55 µm Butt-jointed Distributed Bragg Reflector Lasers Grown Entirely by Low-pressure MOVPE", Y. Tohmori and M. Oishi, Jap. J. App. Phys. 27 (1988), pp L693–695.

Thus, from the foregoing, it will be seen that the embodiments shown in FIGS. 7 to 9 have the advantage that amplification can occur in the active portion without significant gain saturation, due to the increasing width of the active portion 30 along the length of the device and that, the resulting amplified light can then be concentrated within the waveguide region 1 by the action of its boundary, so as to be directed to the output 4 without problems of saturation effects due to gain saturation, as a result of the passive nature of portion 31 of the waveguide, and without the need for additional separate lens structures.

As used herein, the term optical radiation includes visible and non-visible radiation such as ultra-violet and infra-red.

I claim:

1. An optical device comprising an elongate waveguide region having a boundary that extends along the length thereof to an optical output at one end, an optical input at the other end of the waveguide region for introducing optical radiation to be amplified therein, and active material for producing amplification of the optical radiation travelling in the waveguide region, the boundary being configured to concentrate the amplified optical radiation laterally within the waveguide region towards the output.

2. A device as claimed in claim 1 wherein the waveguide region has a width which tapers along the length thereof towards the output.

3. A device as claimed in claim 1 including means (10) for applying an electric current to the active material to produce optical amplification therein.

4. A device as claimed in claim 3 wherein the width of the waveguide region progressively increases along the length thereof from the input to an intermediate region, from which the width of the waveguide region progressively decreases along the length thereof to the output.

5. A device as claimed in claim 4 wherein the rate of increase and decrease of the width of the waveguide region varies along the length thereof.

6. A device as claimed in claim 4 wherein the boundary of the waveguide region is parabolic in shape in regions between the intermediate region and the ends thereof, and conforms to portions of circular arcs at the ends thereof and in the intermediate region.

7. A device as claimed in claim 5 wherein the shape of the boundary is symmetrical on either side of the intermediate region.

8. A device as claimed in claim 1 having a first source of optical data pulses coupled to the input of the waveguide region and a second source of optical radiation coupled to the waveguide region.

9. A device as claimed in claim 8 wherein the radiation from the second source and the data pulses from the first source interact so as to produce gain saturation in the active material, whereby the radiation from the second source is modulated by the data pulses.

10. A device as claimed in claim 9 wherein the data pulses comprise optical radiation at a first wavelength and the radiation from the second source comprises essentially continuous wave optical radiation at a second different wavelength.

11. A device as claimed in claim 10 further comprising a filter coupled to the output of the waveguide region for preferentially passing the modulated radiation at the second wavelength.

12. A device as claimed in claim 10 and coupling means for coupling both the first source and the second source to the input of the waveguide region.

13. A device as claimed in claim 8 wherein the radiation from the sources interacts whereby the radiation from the first source is phase modulated by the data pulses from the second source.

14. A device as claimed in claim 13 further comprising phase responsive means coupled to the output of the waveguide region for comparing the phase modulated signals with the phase of signals from said output.

15. A device as claimed in claim 8 wherein the radiation from the first and second sources interacts to produce radiation at the output which is of a different wavelength from that of the radiation from the second source and the data pulses from the first source.

16. A device as claimed in claim 14 further comprising filtering means coupled to the output of the waveguide region and selectively responsive to said different wavelength at the output.

17. A device as claimed in claim 1 wherein the active material extends over the entire extent of the waveguide region.

18. A device according to claim 1 further including means for profiling the current density that in use passes through the active material for controlling optical gain saturation.

19. A device as claimed in claim 18 further including a conductive layer for feeding an electric current through the active material, the conductive layer being configured in first and second separate portions for applying different values of current to different regions of the active material.

20. A device according to claim 1, wherein the waveguide region includes a first active portion optically coupled to the active material to produce the optical amplification, and a second passive portion which is not coupled to the active material and has its boundary configured to produce said concentration of the amplified light within the waveguide region towards the output.

21. A device as claimed in claim 20 wherein the passive portion has a width that tapers along the length thereof towards the output.

22. A device as claimed in claim 20, wherein the active portion of the waveguide region has a width which increases along the length thereof in a direction towards the output.

23. A device as claimed in claim 20, wherein the waveguide region includes a passive optically transparent layer extending through both of the active and passive portions, and a layer of the active optical amplification, said layer and the passive transparent layer overlying one another in the active portion.

24. A device as claimed in claim 20, wherein the waveguide region includes a heterolayer that comprises the active amplification material in the active portion and a passive transparent layer in the passive portion.

25. A device as claimed in claim 24, wherein the heterolayer has been formed by selectively removing a portion thereof and regrowing the layer in the removed portion with different optical characteristics.

26. A device according to claim 1 further including anti-reflection coatings on said input and said output.

27. A device as claimed in claim 1 wherein the active region comprises a buried heterostructure on a substrate.

28. A device as claimed in claim 27, wherein the active material comprises a layer of InGaAsP disposed between a layer of InP of a first conductivity type and a region of InP of a second conductivity type.

29. A device as claimed in claim 1 wherein the waveguide region comprises a rib waveguide structure.

30. A device as claimed in claim 28 including a layer of InP of a first conductivity type overlaid by a layer of i-InGaAsP that comprises the active material, itself overlaid by a layer of InGaAsP of a second conductivity type, and an overlying strip of InP having a configuration that defines the boundary of said waveguide region in said i-InGaAsP layer.

31. A method of amplifying optical radiation comprising:
introducing optical radiation to an input of a waveguide region;
amplifying the optical radiation introduced to said waveguide region; and
using a boundary of said waveguide region to concentrate the amplified optical radiation laterally within said waveguide region toward an output of said waveguide region.

32. A method according to claim 31, wherein the optical radiation is primarily amplified in a first portion of said waveguide region and concentrated laterally in a second portion of said waveguide region without significant further amplification.

33. An optical device comprising:
an elongate waveguide region having an optical input at one end and an optical output at the other end, and an active material, wherein a boundary extends along the length of said waveguide region from said optical input to said optical output; and
a conductive layer for controlling a current density in said active material to thereby control optical amplification in said waveguide region, wherein
the boundary of the waveguide region is configured to concentrate the amplified optical radiation laterally within the waveguide region towards the optical output.

34. An optical device according to claim 33, wherein the conductive layer comprises a first portion overlying a first portion of said waveguide region and a second portion overlying a second portion of said waveguide region.

35. An optical device according to claim 34, wherein the first and second portions of said conductive layer are connected to different voltages, only one of the voltages being sufficient to produce significant optical amplification in said waveguide region.

36. An optical device according to claim 33, wherein said waveguide region includes an active portion comprising said active material and a passive portion comprising a material transparent to the optical radiation, said conductive layer overlying only said active portion and the optical amplification occurring solely in said active portion.

37. A device for data modulation comprising:
a first coupler for coupling a stream of optical data pulses at a wavelength $\lambda_1$ and essentially continuous wave optical radiation at a second different wavelength $\lambda_2$; and
an optical device comprising a waveguide region having an optical input at one end and an optical output at the other end, and an active material for amplifying optical radiation introduced in said waveguide region via said optical input, wherein
a boundary of the waveguide region is configured to concentrate the amplified optical radiation laterally within the waveguide region towards said optical output, and no-gain saturation occurs in said active material in the absence of the optical data pulses and gain saturation occurs in the presence of the optical data pulses to reduce the level of the continuous wave optical radiation reaching the optical output of said optical device.

38. A device according to claim 37, further comprising:

a filter tuned to the wavelength $\lambda_2$ connected to the optical output of said optical device.

39. A device according to claim 37, further comprising:

a filter tuned to a wavelength $\lambda_3$ connected to the optical output of said optical device.

40. A device according to claim 37, further comprising:

a second coupler for coupling the continuous wave radiation and the amplified optical radiation output by said optical device.

41. A device according to claim 40, further comprising:

a variable gain device for amplifying or attenuating the continuous wave radiation prior to the coupling of the continuous wave radiation and the amplified optical radiation output by said optical device.

\* \* \* \* \*